(12) United States Patent
Chen et al.

(10) Patent No.: US 7,862,363 B2
(45) Date of Patent: Jan. 4, 2011

(54) IC SOCKET WITH FLOATABLE PRESSING DEVICE FOR RECEIVING TESTING IC PACKAGES OF DIFFERENT SIZES

(75) Inventors: Ming-Yue Chen, Tu-Cheng (TW); Hsiu-Yuan Hsu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/549,403

(22) Filed: Aug. 28, 2009

(65) Prior Publication Data

US 2010/0062623 A1 Mar. 11, 2010

(30) Foreign Application Priority Data

Sep. 8, 2008 (TW) .............................. 97216187 U

(51) Int. Cl.
*H01R 12/00* (2006.01)
(52) U.S. Cl. .......................... 439/331; 439/73; 324/755
(58) Field of Classification Search ................ 439/331, 439/73; 324/755, 538
See application file for complete search history.

(56) References Cited

U.S. PATENT DOCUMENTS

| 6,142,809 | A  | * | 11/2000 | Fukunaga | .................. | 439/331 |
| 6,162,066 | A  | * | 12/2000 | Glick et al. | .................... | 439/73 |
| 7,503,772 | B2 | * | 3/2009  | Kobori et al. | ................. | 439/73 |
| 7,656,179 | B2 | * | 2/2010  | Suzuki et al. | ............... | 324/755 |
| 7,736,166 | B2 | * | 6/2010  | Gattuso | ...................... | 439/331 |
| 2007/0049066 | A1 | * | 3/2007 | Ju | .............................. | 439/73 |
| 2007/0259543 | A1 | * | 11/2007 | Hsieh | .......................... | 439/73 |
| 2008/0280478 | A1 | * | 11/2008 | Kenzo et al. | ................ | 439/331 |

* cited by examiner

*Primary Examiner*—Gary F. Paumen
(74) *Attorney, Agent, or Firm*—Andrew C. Cheng; Wei Te Chung; Ming Chieh Chang

(57) ABSTRACT

An IC socket comprises an insulative housing adapted to accommodate an IC package and a pressing device pivotably attached to the insulative housing. The insulative housing defines some first pivoting holes at two opposite ends thereof and some second pivoting holes distant with the first pivoting holes. A pair of first shafts are assembled in the first pivoting hole of the insulative housing to pivotally latch the pressing device on the insulative housing and are movable in a vertical direction, so that the pressing device is floatable and can engage with different packages of different thickness. Two second shafts are assembled in the second pivoting holes. The IC socket further includes a plurality of spring members linking the first shafts and the second shafts to make the pressing device downwardly in a vertical direction.

18 Claims, 7 Drawing Sheets

IC SOCKET WITH FLOATABLE PRESSING DEVICE FOR RECEIVING TESTING IC PACKAGES OF DIFFERENT SIZES

BACKGROUND OF THE INVENTION

1. Field of the Invention

The present invention relates to electrical connectors, and more particularly to an IC socket with floatable pressing device for holding testing IC packages of different sizes.

2. Discussion of the Related Art

A conventional IC socket 1' for testing an IC package (not shown) is shown in FIG. 1. The IC socket 1' includes a socket body 20' with a plurality of terminals 30' resided therein, and a floating frame 50' resiliently mounted upon the socket body 20' with springs 40' disposed between the floating frame 50' and the socket body 20' and adapted to receive the IC package (not shown). The floating frame 50' is movable relative to the socket body 20' in a vertical direction so as to allow the terminals 30' to pass beyond the floating frame 50' for engaging with conductive elements of the IC package (not shown). The IC socket 1' further includes a main pressure body 80' pivotally attached to an end of the socket body 20', a cover 90' pivotally attached to an opposite end of the socket body 20', and a sub-pressure body 60' accommodated within the main pressure body 80'.

The socket body 20' includes a pivoting portion 201' for latching the main pressure body 80' and a supporting portion 202' for mounting the cover 90'. The main pressure body 80' defines a substantially rectangular opening dimensioned to allow the sub-pressure body 60' to be accommodated therewithin. The sub-pressure body 60' is disposed on the main pressure body 80'. A plurality of passageways 600', 800' are correspondingly formed on corresponding sides of the main pressure body 80' and the sub-pressure body 60', and a plurality of fastening members 10' are inserted into the passageways 600' and 800' so as to form a mechanical interconnection between the main pressure body 80' and the sub-pressure body 60'. The fastening element 10' has a pin-like configuration, and defines a slot 100' for engaging with a retention sheet 801', which is inserted within the main pressure body 80' by passing through an elongated recess 802' of the main pressure body 80 so as to retain the fastening element 10'.

The IC socket 1' is adapted for receiving different IC packages (not shown) varying in size, however, the main pressure body 80' and the cover 90' are directly attached to the socket body 20' and can not float in the vertical direction. So the pivoting portion 201' for latching the main pressure body 80' and the supporting portion 202' for mounting the cover 90' need to preset in a certain height for receiving different IC packages (not shown) with different sizes. However, that may cause the main pressure body 80 may loosely rest on an IC package with a thin thickness, that may influence an electrical connection between the conductive elements of the IC package (not shown) and the terminals 30' of the test socket 1'.

Therefore, it is desired to provide a new IC socket which overcomes the above-mentioned disadvantage.

SUMMARY OF THE INVENTION

Accordingly, an object of the present invention is to provide an improved IC socket with floatable pressing device for holding testing IC packages of different thicknesses.

To fulfill the above-mentioned object, an IC socket for electrical connecting a testing IC package and a printed circuit board, comprises an insulative housing adapted to accommodate the testing IC package, a pressing device pivotally attached to the insulative housing. The insulative housing defines two first pivoting holes at two opposite ends thereof. The pressing device is mounted upon the insulative housing. A pair of first shafts are inserting through the first pivoting holes of the insulative housing, respectively to pivotally attach the pressing device to the two opposite ends of on the insulative housing. The first shaft can move in the first pivoting hole in a vertical direction and allow the pressing device float in the vertical direction. The IC socket further comprises a plurality of spring members fixed on the insulative housing to pull the first shafts and the pressing device downwardly.

Other objects, advantages and novel features of the present invention will become more apparent from the following detailed description when taken in conjunction with the accompanying drawings, in which:

DETAILED DESCRIPTION OF THE PREFERRED EMBODIMENTS

Figure 1:
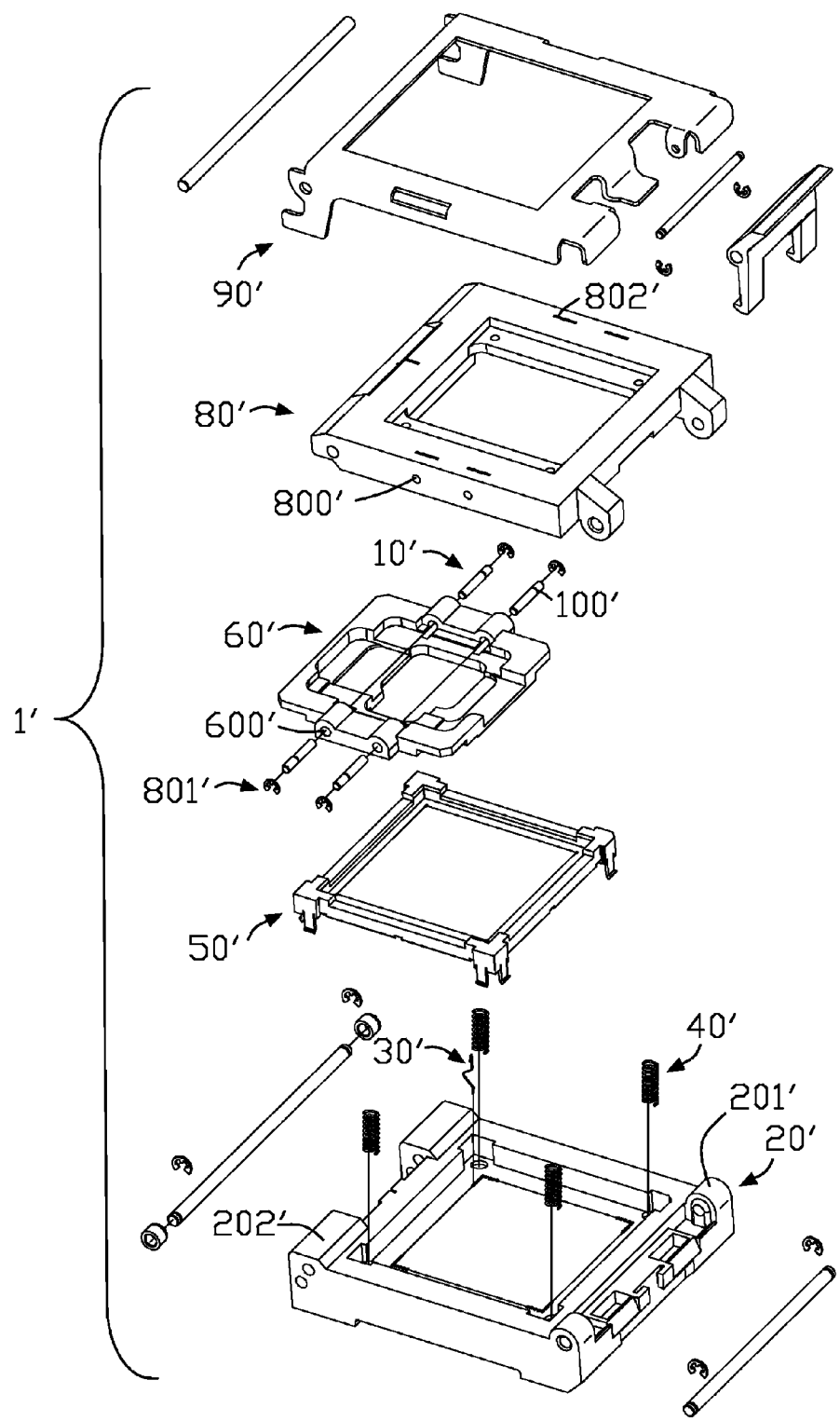
FIG. 1 is an exploded, perspective view of a conventional test socket.
Figure 2:
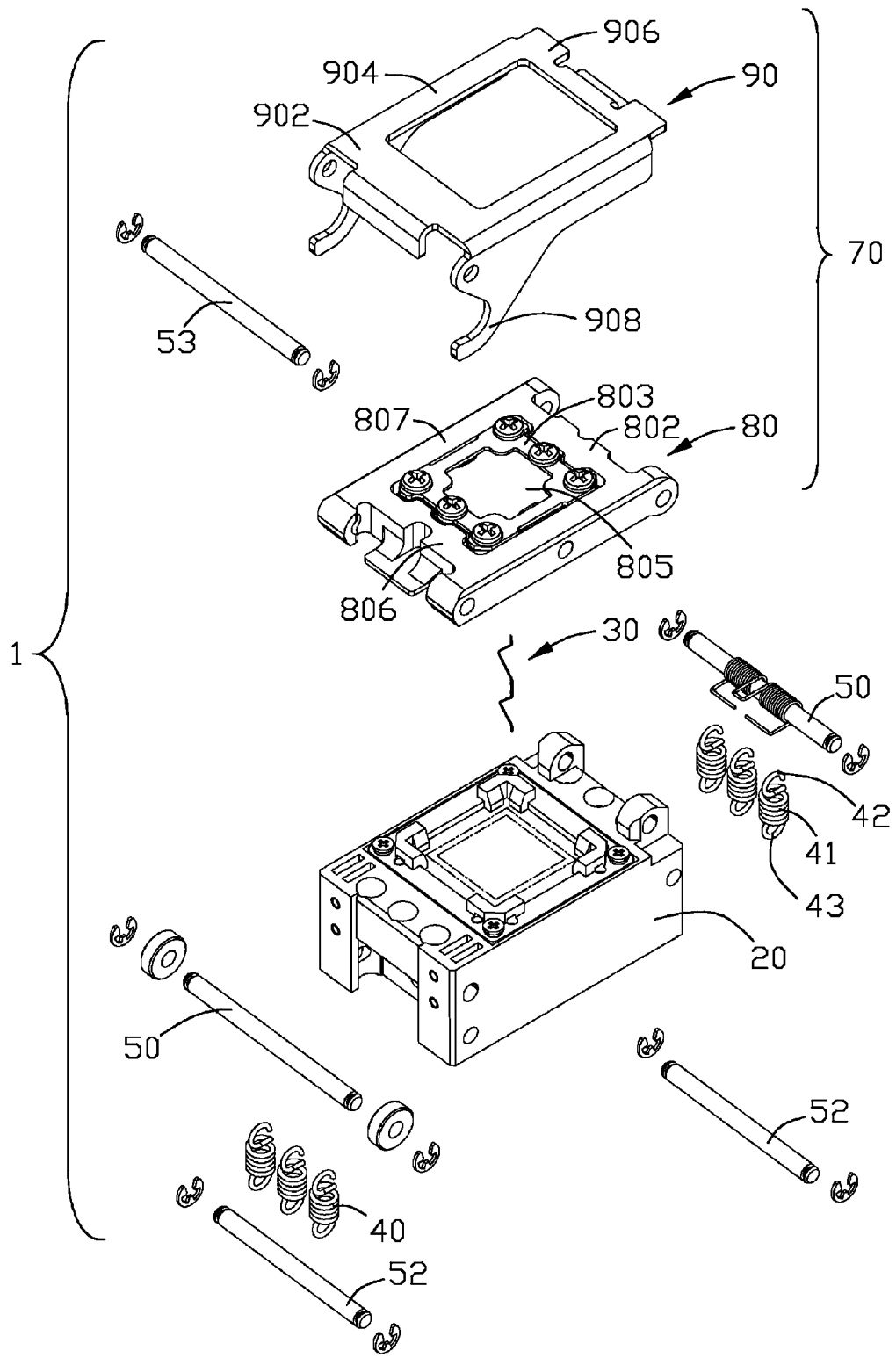
FIG. 2 is an exploded, perspective view of an IC socket according to a preferred embodiment of the present invention.
Figure 3:
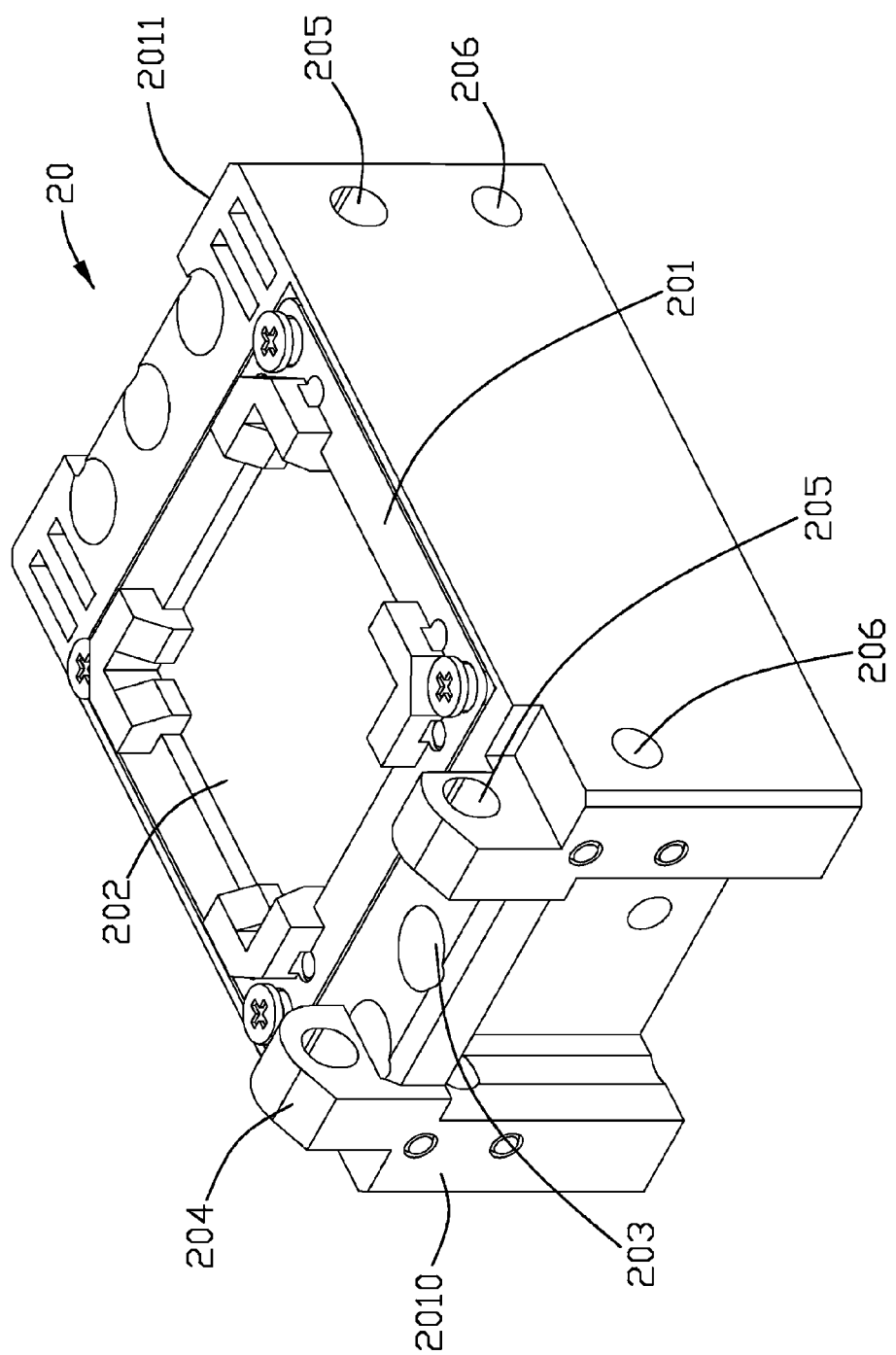
FIG. 3 is a perspective view of an insulative housing of the IC socket shown in FIG. 2.
Figure 4:
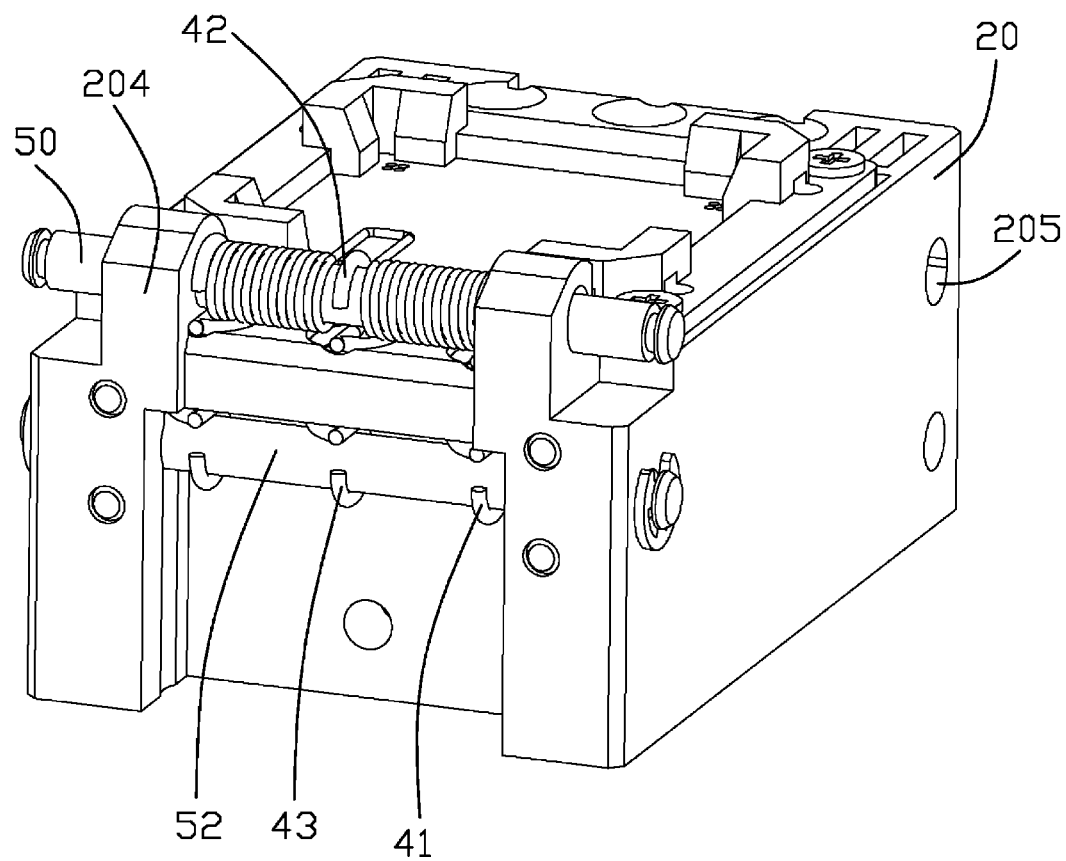
FIG. 4 is a partially assembled, perspective view of the IC socket.
Figure 5:
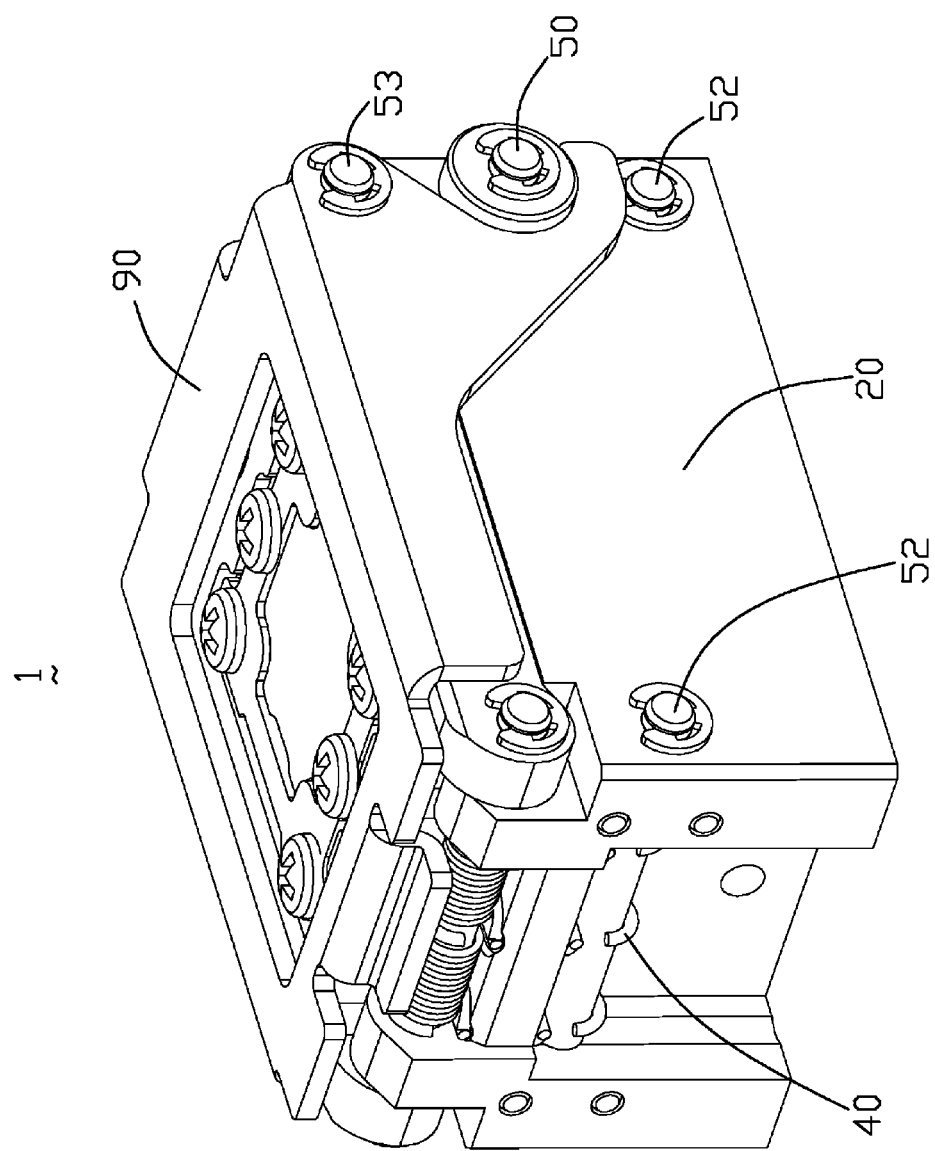
FIG. 5 is an assembled, perspective view of the IC socket of FIG. 2, showing the IC socket at a closed position.

Referring to FIGS. 2 to 7, an IC socket 1 for testing an IC package 10 according to the preferred embodiment of the present invention is shown. The IC socket 1 includes an insulative housing 20 with a plurality of terminals 30, a pressing device 70 pivotably attached to the insulative housing 20 for providing a pressing force on the IC package 10, and an elastic mechanism 40 assembled between the insulative housing 20 and the pressing device 70 to allow the pressing device 70 to move along a vertical direction.

Referring to FIG. 1, the insulative housing 20 is preferably made from an insulative material. In the preferred embodiment, the insulative housing 20 includes a rectangular base 201 and a receiving room 202 defined in the center thereof. The insulative housing 20 defines a plurality of through slots (not shown) extending through the base 201 and arranged below the receiving room 202 for receiving the terminals 30. The insulative housing 20 further defines three through holes 203 arranged in a straight line at each of two opposite first and second ends 2010, 2011 of the base 201. A pair of pivoting portions 204 extend upwardly from the first end 2010 of the base 201. Each pivoting portion 204 defines an elliptical first pivoting hole 205 in the center thereof.

The insulative housing 20 also defines a pair of elliptical first pivoting holes 205 at the second end 2011 opposite to the first end 2010. The first pivoting holes 205 are used to receive a pair of first shafts 50 assembled on the first end 2010 and the second end 2011 of the base 201, respectively. The first shaft 50 is inserted into and through the first pivoting holes 205 on the pivoting portions 204 and synchronously pivotally connects with an end of the pressing device 70. Another first shaft 50 is assembled to the first pivoting holes 205 on the second end 2011 of the base 201. The first shafts 50 can move up and down in the first pivoting holes 205 following with the pressing device 70 which moves along a vertical position relative to the insulative housing 20. The insulative housing 20 further defines some second pivoting holes 206 distant with the first pivoting holes 205. The second pivoting holes 206 on same side are disposed below the first pivoting holes 205 and arranged in another straight line parallel to the straight line on which the corresponding first pivoting holes 205 are arranged. A pair of second shafts 52 are inserted into the second pivoting holes 206.

The elastic mechanism 40 includes six spring members 41 mounted in the through holes 203 at the two opposite ends 2010, 2011 of the base 201. The spring member 41 has a top end 42 and a bottom end 43, each end 42, 43 being hook-shaped. The top end 42 links to the first shaft 50 and the bottom end 43 links to the second shaft 52, so that the springs 41 are disposed between the first shafts 50 and the second shafts 52. A bottom part of the spring member 41 is exposed for the second shaft 52 easily passing throughthere. The spring member 41 can move up-and-down following the first shaft 50 and always pull the pressing device 70 against the IC package 10 received in the insulative housing 20.

The pressing device 70 typically includes a main pressing body 80 and a cover 90. An end of the pressing body 80 is pivotably attached to the first end 2010 of the insulative housing 20, and the cover 90 is pivotably attached to another opposite end of the pressing body 80. The main pressing body 80 is substantially rectangular frame and made of insulative material and includes a first side 802, a second side 806 opposite to the first side 802, and a pair of lateral sides 807 connecting the first side 802 and the second side 806. An opening 805 is defined in the center of the main pressing body 80 adapted for a heat sink (not shown) inserting into and mounted with a protecting board 803.

The cover 90 is generally of a rectangular shape, preferably made of metallic material. The cover 90 includes a pivoting side 902, a fastening side 906 opposite to the pivoting side 902, and a pair of pressing sides 904 connecting the pivoting side 902 and the fastening side 906. And a pair of catches 908 extend downwardly and slightly outwardly from the pivoting side 902 of the cover 90 so as to make the cover 90 be pivotally or rotatably mounted on the insulative housing 20.

In assembly, the first shafts 50 are respectively assembled in the first pivoting holes 205 of the insulative housing 20, and the first side 802 of the main pressing body 80 is pivotally attached to the pivoting portions 204 of the insulative housing 20 via the first shaft 50, and the second side 806 of the main pressing body 80 is pivotally attached to the pivoting side 902 of the cover 90 via a holding shaft 53. The six spring members 41 are respectively mounted in the through holes 203 at the two opposite ends 2010, 2011 of the insulative housing 20, the first shafts 50 are clasped by the top ends 42 of the spring members 41 when passing through the first pivoting holes 205, and the second shafts 52 are inserted into the second pivoting holes 206 of the insulative housing 20 and clasped by the bottom ends 43 of the spring members 41. Thus the two ends of the spring member 41 are fixed on the first shafts 50 and the second shafts 52, respectively. Finally, the pivoting side 902 of the cover 90 is linked on the second side 806 of the main pressing body 80 via the holding shaft 53.

Figure 6:
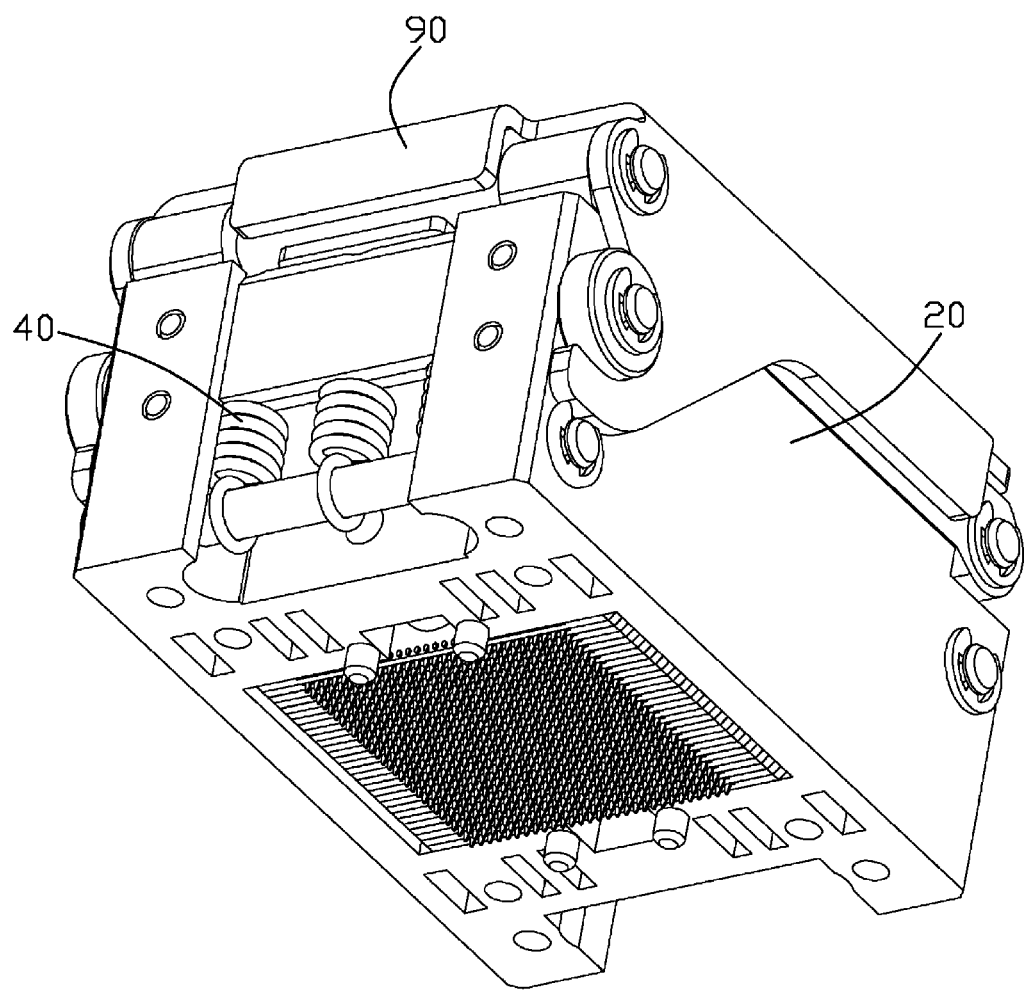
FIG. 6 is similar with the FIG. 5, but taken from a bottom side.
Figure 7:
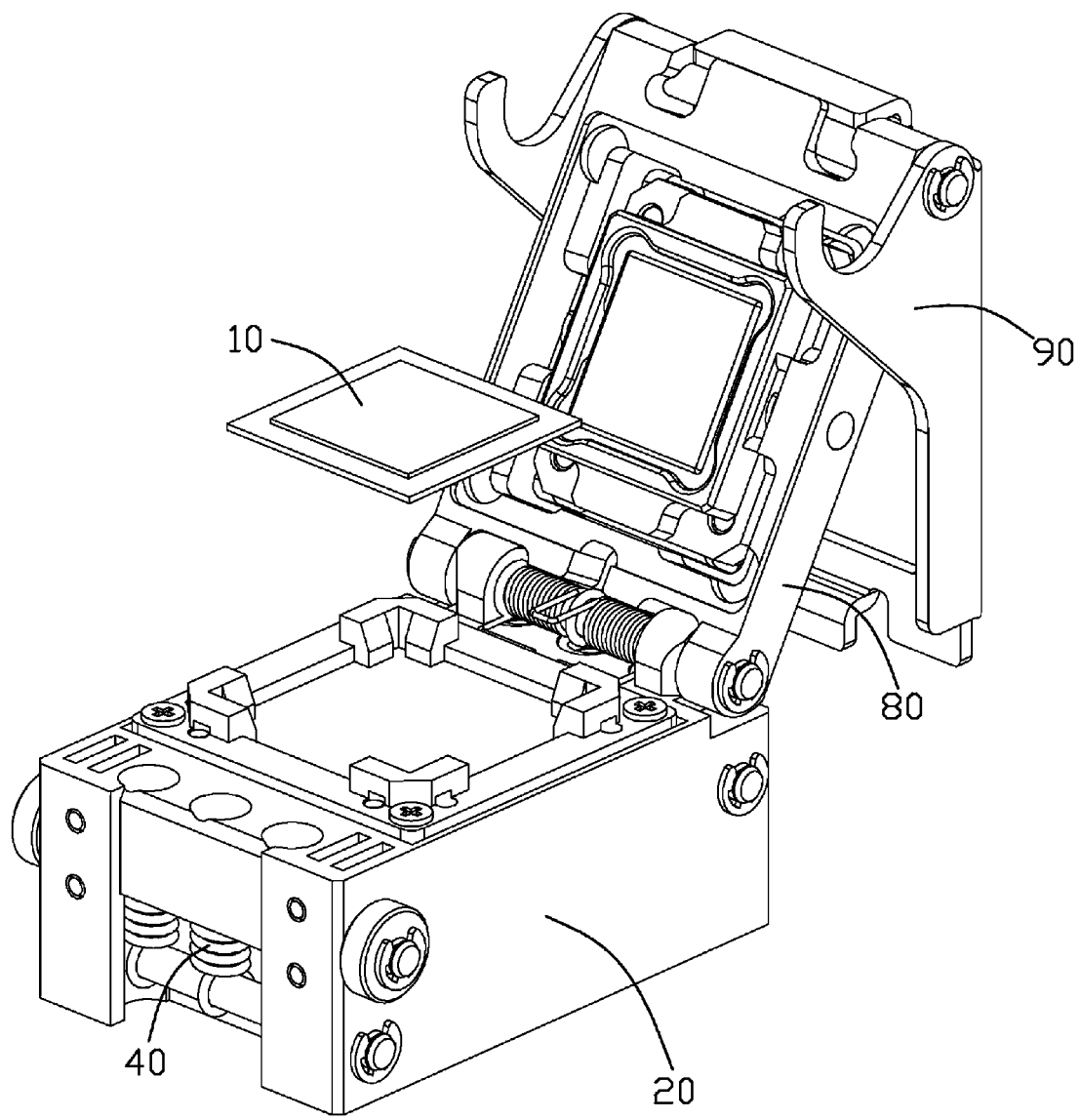
FIG. 7 is an illustration view showing the IC socket at an opened state and a testing IC package to be tested.

Referring particularly to FIG. 6, in use, the cover 90 and the main pressing body 80 are originally located in an opened position, the IC package 10 is preloaded into the receiving room 202 of the insulative housing 20. Then the main pressing member 80 firstly rotates to a horizontal position to press the IC package 10, and then the catches 908 of the cover 90 interlocks the first shaft 50 on the second end 2011 of the insulative housing 20 and rotates downwardly to be a closed position where, the testing IC package 10 is securely hold in the insulative housing 20. And thus it can establish an electrical connection between the IC package 10 and the printed circuit board (not shown).

In the preferred embodiment, the insulative housing 20 defines some elliptic first pivoting holes 205 for receiving the first shafts 50 which link with two opposite sides of the pressing device 70, so the first shafts 50 is movable in the vertical direction and the pressing device 70 is floatable. Furthermore, the IC socket 1 includes some spring members 41 which are disposed between the first shafts 50 and the second shafts 52 fixed to the insulative housing 20 and immovable in the vertical direction, and the spring members 41 can always pull the first shafts 50 and further pull toward the pressing device 70, so the pressing device 70 can tightly press the IC package 10. Since the pressing device 70 is floatable, the IC socket 1 can receive IC package of different thicknesses, and the spring members 41 can ensure the pressing device 70 to press the testing IC package with different thicknesses and the IC socket 1 can provide a steady electrical connection.

While the present invention has been described with reference to embodiments, the description of the invention is illustrative and is not to be construed as limiting the invention. Various of modifications to the present invention can be made to embodiments by those skilled in the art without departing from the true spirit and scope of the invention as defined by the appended claims.

What is claimed is:

1. An IC socket for electrically connecting an IC package and a printed circuit board, comprising:
    an insulative housing adapted to accommodate the IC package, defining two first pivoting holes at two opposite ends thereof;
    a pressing device pivotally attached to the insulative housing and mounted upon the insulative housing;
    a pair of first shafts inserting through the first pivoting holes of the insulative housing, respectively, to pivotally attach the pressing device to the two opposite ends of the insulative housing, the first shaft movable in the first pivoting hole in a vertical direction and allowing the pressing device to float in the vertical direction; and
    a plurality of spring members fixed on the insulative housing to pull the first shafts and the pressing device downwardly.

2. The IC socket as recited in claim 1, wherein further comprising two second shafts, said insulative housing defines a plurality of second pivoting holes distant with the first pivoting holes to allow the second shafts to pass through, two ends of the spring link the first and the second shafts, respectively.

3. The IC socket as recited in claim 2, wherein said second pivoting holes are disposed below the first pivoting holes and arranged in a straight line parallel to a straight line on which the first pivoting holes are arranged.

4. The IC socket as recited in claim 2, wherein said insulative housing further defines some through holes arranged in a straight line at each of the two opposite ends thereof for receiving the spring members.

5. The IC socket as recited in claim 4, wherein the through holes are symmetrically arranged on the two opposite ends of insulative housing.

6. The IC socket as recited in claim 1, wherein said first pivoting holes are elliptical, and said first shafts can move up and down along the first pivoting holes following with the pressing device moving in the vertical direction.

7. The IC socket as recited in claim 1, wherein a pair of pivoting portions extend upwardly from one end of the insulative housing, and the first pivoting holes are defined in the centers of the pivoting portions.

8. The IC socket as recited in claim 7, wherein said pressing device includes a main pressing body with an end thereof pivotally attached to the insulative housing, and a cover pivotally attached to another opposite end of the main pressing body by a holding shaft.

9. The IC socket as recited in claim 8, wherein the cover has a pair of catches extending downwardly from an end of the cover near the holding shaft to pivotally latch corresponding first shaft the insulative housing.

10. An electrical connector assembly comprising:
an IC socket having an insulative housing adapted to accommodate an IC package;
a pressing device pivotally attached to the insulative housing; and
at least one pair of first shafts assembled on two opposite ends of the insulative housing and being moveable in a vertical direction following the pressing device in the vertical direction.

11. The electrical connector assembly as recited in claim 10, wherein said insulative housing defines a pair of first elliptic pivoting holes for the pair of first shafts inserting through.

12. The electrical connector assembly as recited in claim 11, wherein a plurality of spring members fixed on the insulative housing to pull the first shafts and the pressing device downwardly.

13. The electrical connector assembly as recited in claim 11, wherein said IC socket further comprises two second shafts, said insulative housing defines a plurality of second pivoting holes distant with the first pivoting holes to allow the second shafts to pass through, two ends of the spring link to the first and the second shafts, respectively.

14. The electrical connector assembly as recited in claim 13, wherein said second pivoting holes are disposed below the first pivoting holes and arranged in a straight line parallel to a straight line on which the first pivoting holes are arranged.

15. An electrical connector assembly comprising:
an insulative housing defining an IC receiving cavity;
first shaft and second shaft being located around two opposite ends of the housing; and
a pivotable pressing device including a lower part pivotally connected to the first shaft and an upper part hooked to the second shaft; wherein
both said first shaft and said second shaft are floatable at least in a vertical direction while constantly urged to move downwardly for compliantly holding different IC packages in the IC receiving cavity.

16. The electrical connector assembly as claimed in claim 15, wherein said first and second shafts are urged by spring means.

17. The electrical connector assembly as claimed in claim 15, wherein said upper part and said lower part are pivotally connected to each other via a third shaft.

18. The electrical connector assembly as claimed in claim 17, wherein said third shaft is locate around the second shaft while being higher than the second shaft.

* * * * *